US012660314B2

(12) United States Patent
Gao

(10) Patent No.: US 12,660,314 B2
(45) Date of Patent: Jun. 16, 2026

(54) ARRAY SUBSTRATE AND DISPLAY TERMINAL

(71) Applicant: TCL CHINA STAR OPTOELECTRONICS TECHNOLOGY CO., LTD., Shenzhen (CN)

(72) Inventor: Rong Gao, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1188 days.

(21) Appl. No.: 17/622,847

(22) PCT Filed: Dec. 22, 2021

(86) PCT No.: PCT/CN2021/140273
§ 371 (c)(1),
(2) Date: Jun. 22, 2023

(87) PCT Pub. No.: WO2023/108738
PCT Pub. Date: Jun. 22, 2023

(65) Prior Publication Data
US 2024/0038774 A1 Feb. 1, 2024

(30) Foreign Application Priority Data

Dec. 16, 2021 (CN) .......................... 202111543684.6

(51) Int. Cl.
*H10D 86/40* (2025.01)
*G02F 1/1362* (2006.01)

(52) U.S. Cl.
CPC ..... *H10D 86/441* (2025.01); *G02F 1/136286* (2013.01)

(58) Field of Classification Search
CPC ........................ H10D 86/441; G02F 1/136286
See application file for complete search history.

(56) References Cited

U.S. PATENT DOCUMENTS

2006/0192204 A1    8/2006  Yamaguchi et al.
2012/0037908 A1*   2/2012  Wu ...................... H10D 86/441
                                                      257/59

(Continued)

FOREIGN PATENT DOCUMENTS

CN    102566176 A    7/2012
CN    103163703 A    6/2013

(Continued)

OTHER PUBLICATIONS

International Search Report in International application No. PCT/CN2021/140273, mailed on Jul. 27, 2022.

(Continued)

*Primary Examiner* — Peter M Albrecht
(74) *Attorney, Agent, or Firm* — PV IP PC; Peter Stecher; Wei Te Chung

(57) ABSTRACT

An array substrate includes a plurality of sub-pixel units. Each of the sub-pixel units includes a trace region and a pixel electrode region disposed in at least one side of the trace region. The trace region includes a first region and a second region, the first region is provided with at least a thin film transistor, and an aperture ratio of the second region is greater than an aperture ratio of the first region.

16 Claims, 3 Drawing Sheets

(56)     References Cited

U.S. PATENT DOCUMENTS

| 2016/0109765 | A1 | 4/2016 | Lee et al. |
| 2020/0041829 | A1 | 2/2020 | Gan et al. |
| 2024/0038780 | A1* | 2/2024 | Zhang .................. H10D 86/441 |

FOREIGN PATENT DOCUMENTS

| CN | 111025803 | A | 4/2020 |
| CN | 111176041 | A | 5/2020 |
| CN | 212412050 | U | 1/2021 |
| CN | 112799255 | A | 5/2021 |
| CN | 113176691 | A | 7/2021 |
| CN | 113311624 | A | 8/2021 |
| CN | 113741108 | A | 12/2021 |

OTHER PUBLICATIONS

Written Opinion of the International Search Authority in International application No. PCT/CN2021/140273,mailed on Jul. 27, 2022.
Chinese Office Action issued in corresponding Chinese Patent Application No. 202111543684.6 dated Dec. 19, 2022, pp. 1-7.

\* cited by examiner

ARRAY SUBSTRATE AND DISPLAY TERMINAL

FIELD

The present disclosure relates to display technologies, and more particularly, to an array substrate and a display terminal.

BACKGROUND

In a liquid crystal display panel, scan lines are generally arranged in wiring regions of a plurality of pixel units, and the scan lines are connected with a plurality of thin film transistors (TFTs) in the wiring regions.

However, due to the opacity of the scan lines and the connection structure of the scan lines and the thin film transistors, an aperture ratio of the display panel will decrease, which in turn leads to a problem of low light transmittance of the display panel.

Due to the opacity of the scan lines and the connection structure of the scan lines and the thin film transistors in the current display panel, the display panel has the problems of decreased aperture ratio and low light transmittance.

SUMMARY

In view of the above, the present disclosure provides an array substrate and a display terminal to solve technical issues of decreased aperture ratio and low light transmittance due to opacity of scan lines and thin film transistors in a trace region in current display panels.

In order to achieve above-mentioned object of the present disclosure, one embodiment of the disclosure provides:

An array substrate, including a plurality of sub-pixel units, wherein each of the sub-pixel units includes a trace region and a pixel electrode region disposed in at least one side of the trace region; and wherein the trace region includes a first region and a second region, the first region is provided with at least a thin film transistor, and an aperture ratio of the second region is greater than an aperture ratio of the first region.

In one embodiment of the array substrate, the pixel electrode region is extended to the second region.

In one embodiment of the array substrate, the pixel electrode region includes an extension region overlaying the second region.

In one embodiment of the array substrate, the pixel electrode region includes a main electrode region and a secondary electrode region disposed at two opposite sides of the trace region respectively.

In one embodiment of the array substrate, the extension region includes a first extension region extending from the main electrode region to the second region and a second extension region extending from the secondary electrode region to the second region.

In one embodiment of the array substrate, the main electrode region is provided with a main pixel electrode and the secondary electrode region is provided with a secondary pixel electrode.

In one embodiment of the array substrate, the first region is provided with a first thin film transistor connected to the main pixel electrode and a second thin film transistor connected to the secondary pixel electrode.

In one embodiment of the array substrate, the first thin film transistor and the secondary thin film transistor are connected in parallel.

In one embodiment of the array substrate, the first region is further provided with a third thin film transistor connected to the secondary pixel electrode.

In one embodiment of the array substrate, the second thin film transistor and the third thin film transistor are connected in series.

In one embodiment of the array substrate, the secondary pixel electrode is connected to a series circuit of the second thin film transistor and the third thin film transistor.

In one embodiment of the array substrate, the array substrate further includes a main pixel capacitor corresponding to the main pixel electrode, a secondary pixel capacitor corresponding to the secondary pixel electrode, and an auxiliary capacitor connected to the second thin film transistor and the third thin film transistor.

In one embodiment of the array substrate, the array substrate further includes data lines disposed at two opposite side of the pixel unit and a common electrode line disposed between two adjacent data lines.

In one embodiment of the array substrate, the common electrode line is connected to the third thin film transistor.

In one embodiment of the array substrate, the common electrode line divides the trace region into the first region and the second region, and an area of the second region is greater than an area of the first region.

In one embodiment of the array substrate, the array substrate further includes a plurality scan lines, and the plurality of scan lines are disposed across the data lines.

In one embodiment of the array substrate, the scan lines are disposed along a direction connected the first region and the second region and disposed in the trace region.

In one embodiment of the array substrate, a width of one of the scan lines in the second region is smaller than a width of the scan line in the first region in an extension direction of the data lines.

In one embodiment of the array substrate, a width of the first extension region is smaller than or equal to a width of the second extension region in an extension direction of the data lines.

Another embodiment of the disclosure further provides a display terminal, including a terminal body and the array substrate of claim 1, wherein the terminal body and the array substrate are combined to a whole body.

In comparison with prior art, the disclosure provides the trace region includes the first region and the second region. The thin film transistors are gathering to dispose in the first region. The second region is provided with no thin film transistors. Therefore, an opaque area in the second region can be reduced to increase an aperture ratio in the second region and then to increase a light transmittance of the display panel and to improve the display effect.

DESCRIPTION OF REFERENCE SIGNS

Figure 1:
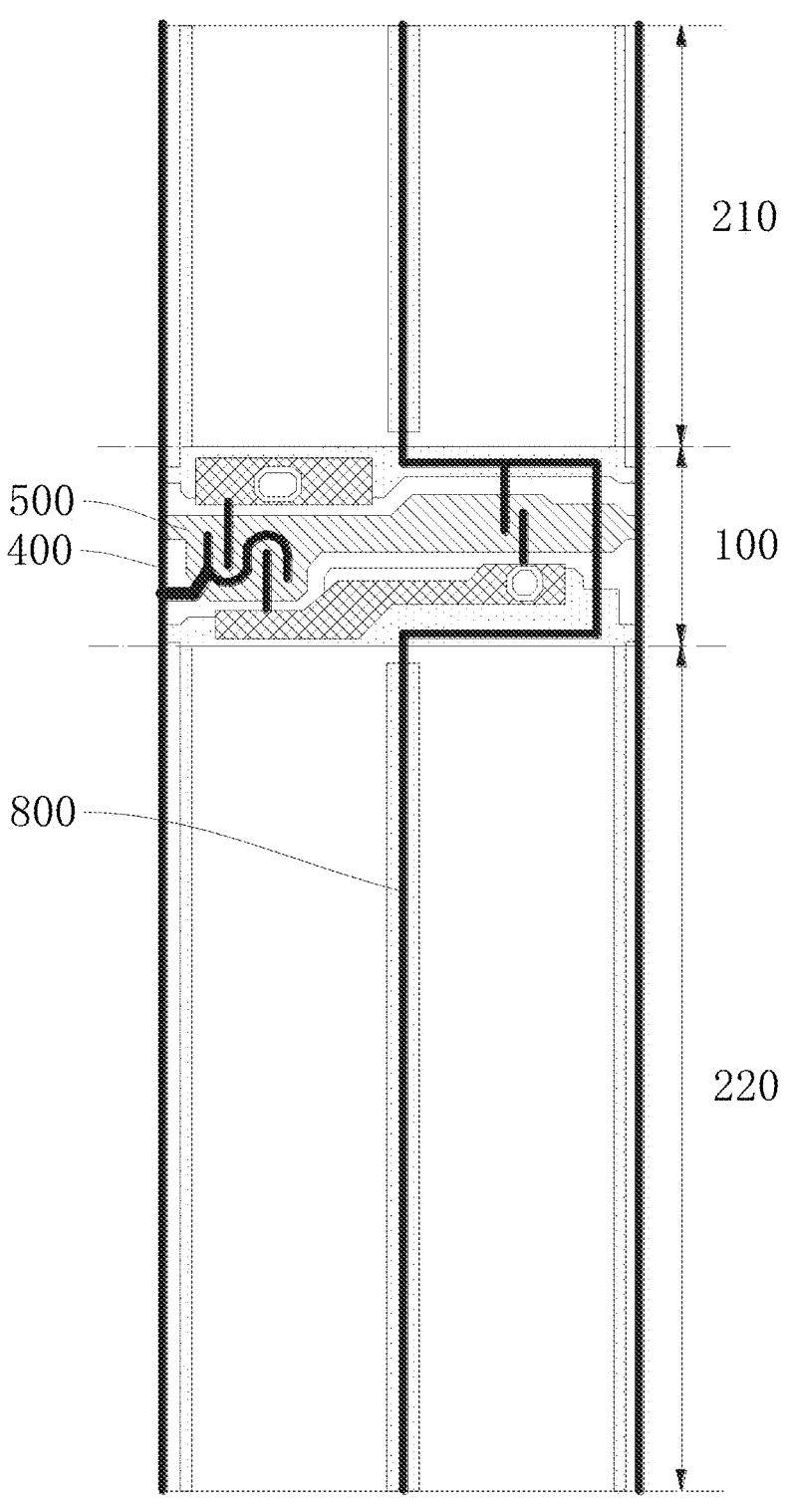
FIG. 1 is a schematic view of a structure of a sub-pixel of prior art.

Sub-pixel unit 101, trace region 100, first region 110, second region 120, pixel electrode region 200, main electrode region 210, first extension region 211, secondary electrode region 220, second extension region 221, thin film transistor 300, first thin film transistor 310, second thin film transistor 320, third thin film transistor 330, data line 400, scan line 500, main pixel capacitor 600, main pixel storage capacitor 610, secondary pixel capacitor 700, auxiliary capacitor 710, and common electrode line 800.

DETAILED DESCRIPTION

The specific structure and functional details disclosed herein are only representative and are used for the purpose of describing exemplary embodiments of the present application. However, this application can be implemented in many alternative forms, and should not be interpreted as being limited only to the embodiments set forth herein.

In the description of this application, it should be understood that the terms "center", "lateral", "upper", "lower", "left", "right", "vertical", "horizontal", "top", The orientation or positional relationship indicated by "bottom", "inner", "outer", etc. is based on the orientation or positional relationship shown in the drawings, and is only for the convenience of describing the application and simplifying the description, and does not indicate or imply the pointed device Or the element must have a specific orientation, be constructed and operated in a specific orientation, and therefore cannot be understood as a limitation of the present application. In addition, the terms "first" and "second" are only used for descriptive purposes and cannot be understood as indicating or implying relative importance or implicitly indicating the number of indicated technical features. Therefore, the features defined with "first" and "second" may explicitly or implicitly include one or more of these features. In the description of this application, unless otherwise specified, "plurality" means two or more. In addition, the term "including" and any variations thereof is intended to cover non-exclusive inclusion.

In large-size ultra (high) definition liquid crystal display panels, pixel design methods that sacrifice aperture ratios such as widening data lines 400, widening scan lines 500, and widening black matrixes are usually used to solve insufficient charging and other optical taste issues. Among this, a scan line 500 is generally arranged in a trace region 100 between a main pixel region and a secondary (sub) pixel region. The widened scan line 500 and a plurality of thin film transistors (TFTs) 300 are connected to each other through a hole in the trace region 100, as shown in FIG. 1.

Currently, this pixel design structure has the following drawbacks: the widened scan lines 500, multiple thin film transistors 300, and the holes structure are generally opaque. The multiple thin film transistors 300 and hole structures scattered in the trace region 100 occupy most of the area of the trace region 100, resulting in a non-transmissive region with a larger area ratio in the trace region 100. In this way, although a pixel size of a large-size display panel increases, an aperture ratio of the pixel does not change or even reduced, which leads to an issue that light transmittance of the large-size display panel is not improved, and an advantage of increasing the pixel size due to the large-size display panel is wasted. This application proposes the following solutions based on the above technical issues.

Figure 2:
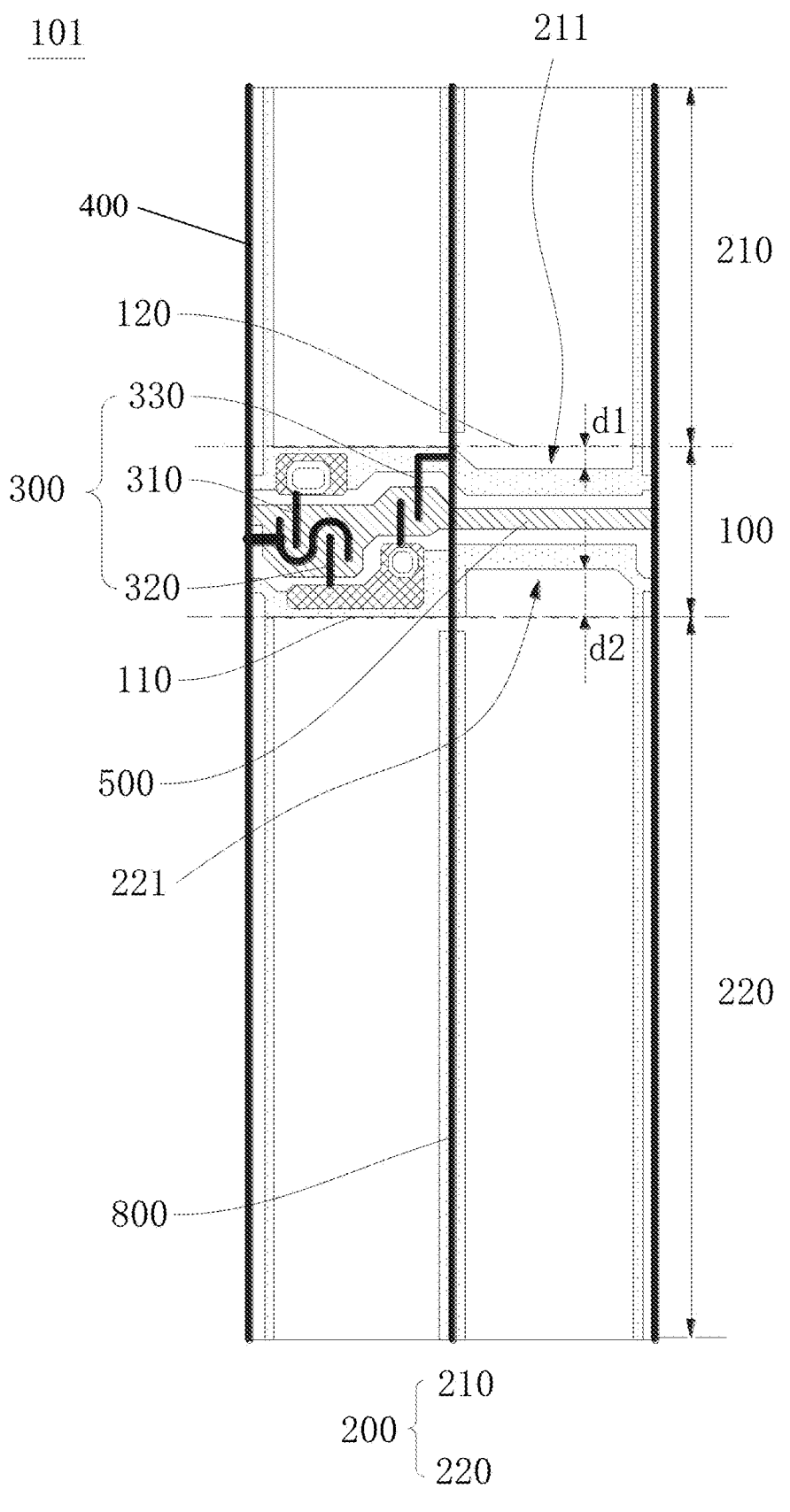
FIG. 2 is a schematic view of a structure of a sub-pixel unit of an array substrate of an embodiment of the present disclosure.
Figure 3:
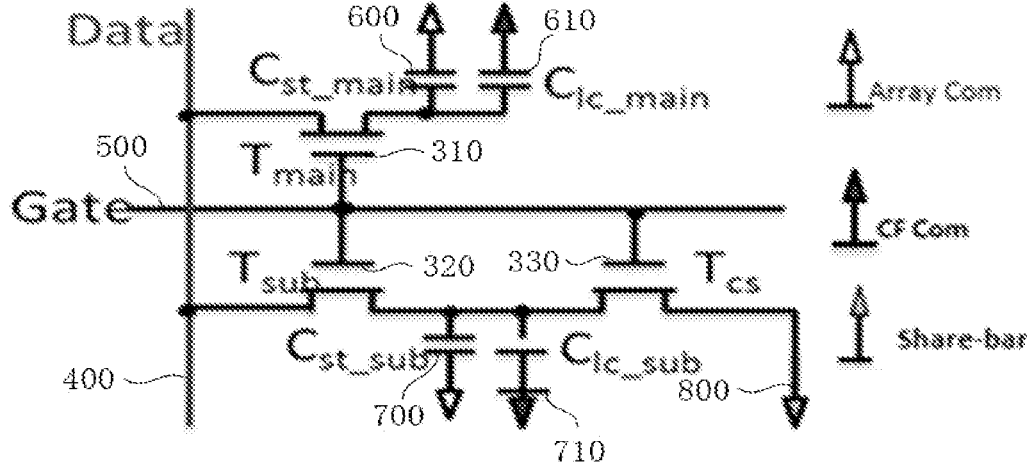
FIG. 3 is a schematic view of a driving circuit of a sub-pixel unit of an embodiment of the present disclosure.

Referring to FIG. 2 and FIG. 3, one embodiment of the disclosure provides an array substrate, including a plurality of sub-pixel units 101, wherein each of the sub-pixel units 101 includes a trace region 100 and a pixel electrode region 200 disposed in at least one side of the trace region 100; and wherein the trace region 100 includes a first region 110 and a second region 120, the first region 110 is provided with at least a thin film transistor 300, and an aperture ratio of the second region 120 is greater than an aperture ratio of the first region 110.

The disclosure provides the trace region 100 includes the first region 110 and the second region 120. The thin film transistors 300 are gathering to dispose in the first region 110. The second region 120 is provided with no thin film transistors 300. Therefore, an opaque area in the second region 120 can be reduced to increase an aperture ratio in the second region 120 and then to increase a light transmittance of the display panel and to improve the display effect.

The technical solution of the present application will now be described in conjunction with specific embodiments. It should be noted that the order of description in the following embodiments is not meant to limit the preferred order of the embodiments.

Please refer to FIG. 2, FIG. 2 is a schematic view of a structure of a sub-pixel unit 101 of an array substrate of an embodiment of the present disclosure. In the array substrate of the present application, a plurality of sub-pixel units 101 are arranged in an array. The array substrate further includes a plurality of data lines 400 and scan lines 500 arranged horizontally and vertically. Among these, one data line 400 corresponds to a column of sub-pixel units 101. That is, one data line 400 is electrically connected to a column of sub-pixel units 101 and is located at one side of the column of sub-pixel units 101. One scan line 500 corresponds to a row of the sub-pixel units 101. That is, one scan line 500 is arranged in the trace region 100 of a row of the sub-pixel units 101 along a direction perpendicular to the data line 400.

In this embodiment, in the trace region 100, the scan line 500 is connected to a gate of the thin film transistor 300 through a hole. The data line 400 is connected to a source (or drain) of the thin film transistor 300. The pixel electrode in the pixel electrode region 200 is electrically connected to a drain (or source) of the thin film transistor 300 to realize an array driving of the sub-pixel units 101 by the array substrate.

Referring to FIG. 2, in the array substrate of the present application, each of the sub-pixel units 101 may only include one pixel electrode region 200. One pixel electrode may be provided in one pixel electrode region 200. The trace region 100 is arranged on one side of the pixel electrode region 200. At this time, each sub-pixel of the array substrate has a single-pixel electrode structure, the pixel structure design is simple, and the manufacturing process difficulty and cost are lower.

In the embodiment, each of the sub-pixel units 101 may include two pixel electrode regions 200. Correspondingly, each of the two pixel electrode regions 200 may be provided one pixel electrode. The trace region 100 is disposed between the two pixel electrode regions 200. At this time, each sub-pixel of the array substrate has a double-pixel electrode structure, one of which is a main pixel electrode and another is a secondary (sub-) pixel electrode. So that the main pixel electrode and the secondary (sub-) pixel electrode are provided in one sub-pixel unit 101 to improve the color shift/contrast issues of large-size display panels.

Please refer to FIG. 2. In one embodiment of the array substrate, the pixel electrode region 200 is extended to the second region 120. The pixel electrode region 200 includes an extension region overlaying the second region 120.

In the embodiment, the pixel electrode region 200 is extended to the second region 120, the pixel electrode disposed in the pixel electrode region 200 is also extended into the second region 120. It is equivalent to extending the aperture area of the sub-pixels (overlapped with the pixel electrode region 200) toward the second region 120, thereby increasing the aperture ratio of each sub-pixel, and thereby increasing the overall light transmittance of the display panel and improving the display effect.

Please refer to FIG. 2. In one embodiment of the array substrate, the pixel electrode region 200 includes a main electrode region 210 and a secondary electrode region 220 disposed at two opposite sides of the trace region 100 respectively.

In one embodiment of the array substrate, the extension region includes a first extension region 211 extending from the main electrode region 210 to the second region 120 and a second extension region 221 extending from the secondary electrode region 220 to the second region 120. That is, in this embodiment, the main pixel electrode may extend into the first extension region 211, and the secondary pixel electrode may extend into the second extension area 221. So that the aperture area of the main electrode region 210 and the secondary electrode region 220 can be expanded to a certain extent. That is, the aperture ratio of the primary electrode region 210 and the secondary electrode region 220 can be increased correspondingly, and the aperture ratios of the primary electrode region 210 and the secondary electrode region 220 are kept adapted to better improve the display effect of the display panel.

Please refer to FIG. 2 and FIG. 3. FIG. 3 is a schematic view of a driving circuit of a sub-pixel unit of an embodiment of the present disclosure. In one embodiment of the array substrate, the first region 110 is provided with a first thin film transistor 310 connected to the main pixel electrode and a second thin film transistor 320 connected to the secondary pixel electrode. The first thin film transistor 310 and the secondary thin film transistor 320 are connected in parallel.

In this embodiment, a gate of the first thin film transistor 310 is connected to the scan line 500 through a hole. A source (or drain) of the first thin film transistor 310 is connected to the main pixel electrode. A drain (or source) of the first thin film transistor 310 is connected to the data line 400. A gate of the second thin film transistor 320 is connected to the scan line 500 through a hole. A source (or drain) of the second thin film transistor 320 is connected to the secondary pixel electrode. A drain (or source) of the second thin film transistor 320 is connected to the data line 400.

In this embodiment, since the first thin film transistor 310 and the second thin film transistor 320 are connected in parallel, the same scan line 500 can switch both transistors, and the same data line 400 can be connected to the main pixel electrode and the secondary pixel electrode to input the same voltage signal to realize the synchronous operation of the main electrode region 210 and the secondary electrode region 220, which can avoid or reduce issues such as flicker.

Please refer to FIG. 3. In one embodiment of the array substrate, the first region 110 is further provided with a third thin film transistor 330 connected to the secondary pixel electrode. The second thin film transistor 320 and the third thin film transistor 330 are connected in series. The secondary pixel electrode is connected to a series circuit of the second thin film transistor 320 and the third thin film transistor 330.

In this embodiment, a gate of the third thin film transistor 330 is connected to the scan line 500. A source (or drain) of the third thin film transistor 330 is connected to the drain (or source) of the second thin film transistor 320. A drain (or source) of the third thin film transistor 330 is grounded.

In this embodiment, the third thin film transistor 330 and the second thin film transistor 320 are connected in series. The secondary pixel electrode is connected to the series circuit between the second thin film transistor 320 and the third thin film transistor 330. In the circuit, by connecting the third thin film transistor 330 with other electrical components (such as capacitors, etc.), the second thin film transistor 320 and the third thin film transistor 330 can jointly control the secondary pixel electrode, thereby making a working state between the secondary pixel electrode and the main pixel electrode more stable and reducing display abnormalities.

Please refer to FIG. 3. In one embodiment of the array substrate, the array substrate further includes a main pixel capacitor 600 corresponding to the main pixel electrode, a secondary pixel capacitor 700 corresponding to the secondary pixel electrode, and an auxiliary capacitor 710 connected to the second thin film transistor 320 and the third thin film transistor 330.

In this embodiment, a first terminal of the main pixel capacitor 600 is connected to the drain (or source) of the first thin film transistor 310, and a second terminal of the main pixel capacitor 600 is connected to a common voltage terminal. The main pixel capacitor 600 can also be connected in parallel to a main pixel storage capacitor 610, so that the main pixel electrode can be continuously discharged for a certain period after the first thin film transistor 310 is turned off, and the display image can be maintained until the next frame is refreshed.

In this embodiment, a first terminal of the secondary pixel capacitor 700 is connected to the drain (or source) of the second thin film transistor 320, and a second terminal of the sub-pixel capacitor 700 is connected to the common voltage terminal.

In this embodiment, the auxiliary capacitor 710 may be used as the auxiliary capacitor 710 of the secondary pixel electrode. A first terminal of the auxiliary capacitor 710 can be connected to the drain (or source) of the second thin film transistor 320 and the source (or drain) of the third thin film transistor 330. A second terminal can be connected to the common voltage terminal on a color filter substrate (not shown in the figure).

In this embodiment, by providing the main pixel electrode and the sub-pixel electrode with a pixel capacitor and a storage capacitor, the storage capacitor in the sub-pixel unit 101 can discharge the pixel electrode within a certain period after the scan signal is turned off. So that the sub-pixel unit 101 maintains a display image until the next frame is refreshed, thereby reducing display abnormalities such as strobe and screen flicker.

In this embodiment, the auxiliary capacitor 710 can cause a voltage difference between the main electrode region 210 and the secondary electrode region 220 in the sub-pixel unit 101, so that deflection angles of the liquid crystal molecules in the main electrode region 210 and deflection angles of the liquid crystal molecules in the secondary electrode region 220 are different, so as to improve the issue of color deviation in large viewing angle.

Please refer to FIG. 2 and FIG. 3. In one embodiment of the array substrate, the array substrate further includes data lines 400 disposed at two opposite side of the pixel unit and a common electrode line 800 disposed between two adjacent data lines 400. The common electrode line 800 is connected to the third thin film transistor 330 to ground the third thin film transistor 330 through the common electrode line 800.

In one embodiment of the array substrate, the common electrode line 800 is disposed in parallel with the data line 400. The common electrode line 800 divides the trace region 100 into the first region 110 and the second region 120, and an area of the second region 120 is greater than an area of the first region 110.

In this embodiment, the area of the second region 120 may be equal to the area of the first region 110. At this time, the common electrode line 800 is exactly disposed on a central symmetry line of the two adjacent data lines 400. In this embodiment, the common electrode line 800 is arranged on the center symmetry line of two adjacent data lines 400, and the trace region 100 is divided into the first region 110 and the second region 120 through the common electrode line 800. The trace region 100 can accurately divide to facilitate the pixel electrode region 200 extending into the trace region 100 and can change a bending winding design of the common electrode line 800 in the trace region 100 in the conventional pixel structure to a linear design, which not only reduces the difficulty of the manufacturing process of the common electrode line 800, but also saves the material of the common electrode line 800, which is beneficial to reduce the cost.

In this embodiment, the area of the second region 120 may be greater than the area of the first region 110. In this case, the common electrode line 800 may be disposed toward the first region 110 when passing through the trace region 100, thereby further expanding the area of the second region 120 and further improving the aperture ratio of the sub-pixel unit 101. At this time, the arrangement of the first thin film transistor 310, the second thin film transistor 320, and the third thin film transistor 330 in the first region 110 is more concentrated, and the difficulty of the manufacturing process is correspondingly increased.

Please refer to FIG. 2. In one embodiment of the array substrate, the scan lines 500 are disposed along a direction (namely, a row direction of the sub-pixel units 101) connected the first region 110 and the second region 120 and disposed in the trace region 100. A width of one of the scan lines 500 in the second region 120 is smaller than a width of the scan line 500 in the first region 110 in an extension direction of the data lines 400.

In this embodiment, the first thin film transistor 310, the second thin film transistor 320, and the third thin film transistor 330 are centrally arranged in the first region 110, so that no thin film transistor 300 and hole are provided within the second region 120. It can reduce the width of the scan line 500 in the second region 120 to reduce occupation ratio of the opaque area in the second region 120 and further to improve the aperture ratio.

Please refer to FIG. 2. In one embodiment of the array substrate, a width d1 of the first extension region 211 is smaller than or equal to a width d2 of the second extension region 221 in an extension direction of the data lines 400.

In this embodiment, in the pixel electrode region 200, the area of the main electrode region 210 is less than or equal to the area of the secondary electrode region 220. That is, in the extending direction of the data line 400, a length of the main electrode region 210 may be less than or equal to a length of the secondary electrode region 220. Correspondingly, in the extension direction of the data line 400, the width d1 of the first extension region 211 is less than or equal to the width d2 of the secondary extension region 221, namely, the area of the first extension region 211 is smaller than or equal to the area of the secondary extension region 221.

Preferably, in this embodiment, in the extension direction of the data line 400, the width d1 of the first extension region 211 is smaller than the width d2 of the second extension region 221. For example, as shown in FIG. 2, in the extending direction of the data line 400, the width d1 of the first extension region 211 may be micrometers, and the width d2 of the second extension region 221 may be 21.52 micrometers. It should be noted that the width d1 of the first extension region 211 and the width d2 of the second extension region 221 in this embodiment can be adjusted according to actual conditions. This embodiment only uses the above-mentioned values as an example. The width of the first extension region 211 and the second extension region 221 is not specifically limited.

Through the above configuration in this embodiment, the area of the first extension region 211 can be adapted to the area of the main electrode region 210, and the area of the second extension region 221 can be adapted to the area of the secondary electrode region 220. So that the increase in the aperture ratio of the main electrode region 210 is the same or similar to the increase in the aperture ratio of the secondary electrode region 220. The difference of increasements of aperture ratio between the main electrode region 210 and the secondary electrode region 220 is reduced as much as possible to further reduce the color deviation, uneven brightness and other display defects.

Another embodiment of the disclosure further provides a display terminal, including a terminal body and aforementioned array substrate, wherein the terminal body and the array substrate are combined to a whole body. In this embodiment, the display terminal may be a smart terminal such as a mobile phone, a computer, a TV, or a watch.

In comparison with prior art, the disclosure provides the trace region 100 includes the first region 110 and the second region 120. The thin film transistors 300 are gathering to dispose in the first region 110. The second region 120 is provided with no thin film transistors 300. Therefore, an opaque area in the second region 120 can be reduced to increase an aperture ratio in the second region 120 and then to increase a light transmittance of the display panel and to improve the display effect. After adopting the above technical solution of the present application, the aperture ratio of the display panel can be increased by at least 3.4%, that is, the light transmittance of the display panel can be increased by at least 3.4%.

In summary, although the application has been disclosed as above in preferred embodiments, the above-mentioned preferred embodiments are not intended to limit the application. Those of ordinary skill in the art can make various decisions without departing from the spirit and scope of the application. Such changes and modifications, so the protection scope of this application is subject to the scope defined by the claims.

What is claimed is:

1. An array substrate, comprising a plurality of sub-pixel units, wherein each of the sub-pixel units comprises a trace region and a pixel electrode region disposed in at least one side of the trace region; and wherein the trace region comprises a first region and a second region, the first region is provided with at least a thin film transistor, and an aperture ratio of the second region is greater than an aperture ratio of the first region;

the pixel electrode region is extended to the second region, the pixel electrode region comprises an extension region overlaying the second region, the pixel electrode region comprises a main electrode region and a secondary electrode region disposed at two opposite sides of the trace region respectively, and the extension region comprises a first extension region extending from the main electrode region to the second region and a second extension region extending from the secondary electrode region to the second region.

2. The array substrate according to claim 1, wherein the main electrode region is provided with a main pixel electrode and the secondary electrode region is provided with a secondary pixel electrode.

3. The array substrate according to claim 2, wherein the first region is provided with a first thin film transistor connected to the main pixel electrode and a second thin film transistor connected to the secondary pixel electrode.

4. The array substrate according to claim 3, wherein the first thin film transistor and the second thin film transistor are connected in parallel.

5. The array substrate according to claim 3, wherein the first region is further provided with a third thin film transistor connected to the secondary pixel electrode.

6. The array substrate according to claim 5, wherein the second thin film transistor and the third thin film transistor are connected in series.

7. The array substrate according to claim 6, wherein the secondary pixel electrode is connected to a series circuit of the second thin film transistor and the third thin film transistor.

8. The array substrate according to claim 5, wherein the array substrate further comprises a main pixel capacitor corresponding to the main pixel electrode, a secondary pixel capacitor corresponding to the secondary pixel electrode, and an auxiliary capacitor connected to the second thin film transistor and the third thin film transistor.

9. The array substrate according to claim 5, wherein the array substrate further comprises data lines disposed at two opposite sides of a sub-pixel unit of the plurality of sub-pixel units and a common electrode line disposed between two adjacent data lines.

10. The array substrate according to claim 9, wherein the common electrode line is connected to the third thin film transistor.

11. The array substrate according to claim 10, wherein the common electrode line divides the trace region into the first region and the second region, and an area of the second region is greater than an area of the first region.

12. The array substrate according to claim 9, wherein the array substrate further comprises a plurality of scan lines, and the plurality of scan lines are disposed across the data lines.

13. The array substrate according to claim 12, wherein the scan lines are disposed along an arrangement direction of the first region and the second region and disposed in the trace region.

14. The array substrate according to claim 13, wherein a width of one of the scan lines in the second region is smaller than a width of the scan line in the first region in an extension direction of the data lines.

15. The array substrate according to claim 12, wherein a width of the first extension region is smaller than or equal to a width of the second extension region in an extension direction of the data lines.

16. A display terminal, comprising a terminal body and an array substrate, wherein the terminal body and the array substrate are combined to a whole body, and the array substrate comprises a plurality of sub-pixel units, wherein each of the sub-pixel units comprises a trace region and a pixel electrode region disposed in at least one side of the trace region; and wherein the trace region comprises a first region and a second region, the first region is provided with at least a thin film transistor, and an aperture ratio of the second region is greater than an aperture ratio of the first region;

the pixel electrode region is extended to the second region, the pixel electrode region comprises an extension region overlaying the second region, the pixel electrode region comprises a main electrode region and a secondary electrode region disposed at two opposite sides of the trace region respectively, and the extension region comprises a first extension region extending from the main electrode region to the second region and a second extension region extending from the secondary electrode region to the second region.

* * * * *